United States Patent
Fan et al.

(10) Patent No.: US 10,079,487 B2
(45) Date of Patent: Sep. 18, 2018

(54) CLAMP CIRCUIT FOR ELECTRICAL OVERSTRESS AND ELECTROSTATIC DISCHARGE

(71) Applicant: Apple Inc., Cupertino, CA (US)

(72) Inventors: Xiaofeng Fan, San Jose, CA (US); Xin Y. Zhang, Cupertino, CA (US); Junjun Li, Hopewell Junction, CA (US)

(73) Assignee: Apple Inc., Cupertino, CA (US)

( * ) Notice: Subject to any disclaimer, the term of this patent is extended or adjusted under 35 U.S.C. 154(b) by 263 days.

(21) Appl. No.: 15/175,792

(22) Filed: Jun. 7, 2016

(65) Prior Publication Data

US 2017/0214241 A1 Jul. 27, 2017

Related U.S. Application Data

(60) Provisional application No. 62/281,351, filed on Jan. 21, 2016.

(51) Int. Cl.

| | |
|---|---|
| *H02H 3/22* | (2006.01) |
| *H02H 9/04* | (2006.01) |
| *H02H 1/00* | (2006.01) |
| H05K 1/02 | (2006.01) |
| H01L 27/02 | (2006.01) |
| H02H 3/20 | (2006.01) |

(52) U.S. Cl.
CPC .......... *H02H 9/046* (2013.01); *H02H 1/0007* (2013.01); *H01L 27/0285* (2013.01); *H02H 3/20* (2013.01); *H02H 9/041* (2013.01); *H05K 1/0259* (2013.01)

(58) Field of Classification Search
USPC .......................................... 361/56, 91.1, 111
See application file for complete search history.

(56) References Cited

U.S. PATENT DOCUMENTS

| | | | |
|---|---|---|---|
| 5,333,105 A | * | 7/1994 | Fortune ................. H02H 9/041 361/111 |
| 7,755,871 B2 | | 7/2010 | Ker |
| 2007/0115600 A1 | | 5/2007 | Lohr |
| 2009/0268360 A1 | * | 10/2009 | Shinomiya ............ H02H 9/046 361/56 |
| 2015/0138679 A1 | | 5/2015 | Venkatasubramanian |

* cited by examiner

*Primary Examiner* — Danny Nguyen
(74) *Attorney, Agent, or Firm* — Meyertons, Hood, Kivlin, Kowert & Goetzel, P.C.

(57) ABSTRACT

An apparatus includes a device, a comparison circuit, and a switch. The device includes a first terminal coupled to a first power supply signal, and a second terminal coupled to a ground reference. The comparison circuit is configured to compare a first voltage level on the first power supply signal to a second voltage level of a second power supply signal, and enable the device in response to a determination that the first voltage level is greater than the second voltage level. The switch circuit is configured to couple a power supply terminal of the comparison circuit to the first power supply signal in response to determining that the first voltage level is greater than the second voltage level, and to couple the power supply terminal to the second power supply signal in response to determining that the first voltage level is less than the second voltage level.

20 Claims, 8 Drawing Sheets

CLAMP CIRCUIT FOR ELECTRICAL OVERSTRESS AND ELECTROSTATIC DISCHARGE

PRIORITY CLAIM

This application claims priority to U.S. Provisional Patent Application No. 62/281,351 filed Jan. 21, 2016.

BACKGROUND

Technical Field

Embodiments described herein are related to the field of semiconductor integrated circuits, and more particularly to electrostatic discharge protection circuits employed to reduce damage to circuits caused by electrical overstress.

Description of the Related Art

In general terms, electrical overstress (EOS) refers to an electronic component or semiconductor integrated circuit (IC) being exposed to a voltage and/or current with a value greater than the component is designed to handle. EOS may cause an IC to operate incorrectly (e.g., "glitch") or, in more extreme cases, can cause physical damage to circuits in the IC. EOS can have various causes, such as, for example, improper power source, incorrect power-on sequencing, electro-magnetic interference (EMI), or electrostatic discharge (ESD).

ESD is a sudden electrical current flow between two differently charged surfaces. As implied in the name, ESD is caused by an accumulation of static charge on a given surface. The accumulated charge may result in a significant difference in voltage potential between the charged surface and another surface. When the two surfaces are electrically shorted together, come into contact, or a dielectric breakdown occurs, the charged surface may discharge onto the surface with a lower voltage potential until the difference in voltage between the surfaces is low enough to prevent further discharging. Since the voltage difference prior to discharge may be large, the corresponding currents during discharge may also be large.

Semiconductor ICs may be particularly vulnerable to the adverse effects of ESD. The large currents that can be produced by ESD can damage or destroy circuitry. Accordingly, during manufacturing and installation of electronic systems utilizing ICs, special handling procedures may be followed to prevent damage resulting from an ESD event. Furthermore, many ICs may have ESD protection circuitry built in. Such circuitry may include a sensor and a clamp circuit. The sensor may sense the occurrence of an ESD event, and in response to sensing the ESD event, the sensor may cause activation of the clamp circuit to provide an electrical path through which the current may be safely discharged.

SUMMARY OF THE EMBODIMENTS

Various embodiments of ESD circuitry are disclosed. Broadly speaking, a system, an apparatus, and a method are contemplated in which the apparatus may include a device that includes a first terminal coupled to a first power supply signal, and a second terminal coupled to a ground reference. The device may be configured to couple the first terminal to the second terminal in response to an assertion of an enable signal. The apparatus may also include a comparison circuit configured to compare a first voltage level on the first power supply signal to a second voltage level of a second power supply signal, and to assert the enable signal in response to a determination that the first voltage level is greater than the second voltage level. The apparatus may also include a switch circuit configured to couple a power supply terminal of the comparison circuit to the first power supply signal in response to a determination that the first voltage level is greater than the second voltage level, and to couple the power supply terminal of the comparison circuit to the second power supply signal in response to a determination that the first voltage level is less than the second voltage level.

In a further embodiment, the comparison circuit may include a capacitor. A first terminal of the capacitor may be coupled to a first input of the comparison circuit and a second terminal of the capacitor may be coupled to the ground reference. In another embodiment, the comparison circuit may include a resistor. A first terminal of the resistor may be coupled to the first input of the comparison circuit and a second terminal of the resistor may be coupled to the power supply terminal of the comparison circuit.

In one embodiment, the comparison circuit may include a voltage reduction circuit configured to generate a comparison voltage signal dependent upon the voltage level of the second power supply signal. A third voltage level of the comparison voltage signal may be less than the second voltage level of the second power supply signal. In another embodiment, the comparison circuit may include a delay circuit coupled between the second power supply signal and a first input of the comparison circuit. The delay circuit may be configured to delay propagation of changes in the second voltage level of the second power supply signal to the first input of the comparison circuit.

In an embodiment, the device may include a field-effect transistor (FET). In a further embodiment, the comparison circuit may include a digital comparator, and an output of the digital comparator may be coupled to the gate terminal of the FET.

BRIEF DESCRIPTION OF THE DRAWINGS

The following detailed description makes reference to the accompanying drawings, which are now briefly described.

Figure 1:
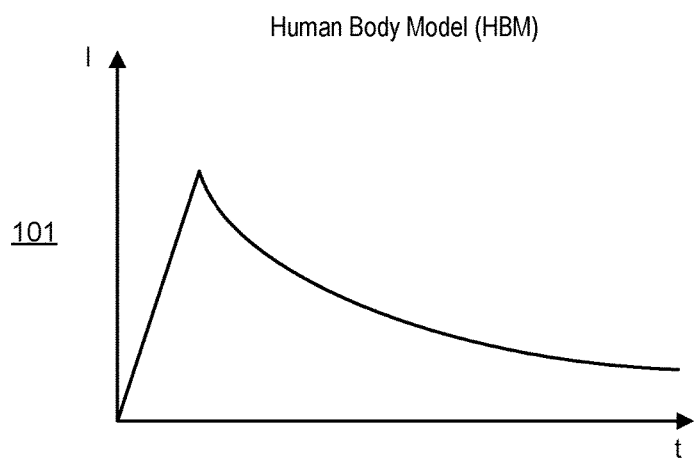
FIG. 1 illustrates charts of different types of electrostatic discharge (ESD) events.
Figure 1:
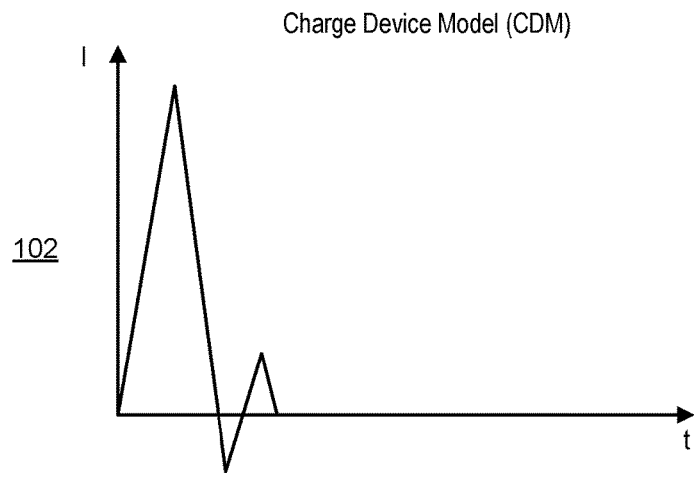

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Many terms commonly used in reference to IC designs are used in this disclosure. For the sake of clarity, the intended definitions of some of these terms, unless stated otherwise, are as follows.

A Field-Effect Transistor (FET) describes a type of transistor that may be used in modern digital logic designs. A Metal-Oxide-Semiconductor Field-Effect Transistor (MOSFET) is one type of FET design that is designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

The embodiments illustrated and described herein may employ CMOS circuits. In various other embodiments, however, other suitable technologies may be employed.

Referring to FIG. 1, charts of different types of ESD events are illustrated. Chart 101 shows an embodiment of a human body model (HBM) ESD event in terms of voltage (V) over time (t). Chart 102 illustrates an embodiment of a charge device model (CDM) ESD event in terms of current (I) over time (t). It is noted that the time scales for each chart may be different.

The human body model is used to model ESD events resulting from interactions with human beings. Dependent upon various factors, humans accumulate charge through movement, such as, for example, walking across a carpeted floor. The charge device model, on the other hand, is used to model ESD events resulting from a charged device coming into contact with a grounded surface. Again dependent upon various factors, the plastic body of an IC may generate charge through movement, such as, for example, sliding through a chute during a manufacturing process.

As shown in the HBM chart 101, a pulse from an HBM-based ESD event may be (relative to a CDM-based ESD event) smaller in current and longer in duration. The pulse in chart 101 resembles a 2 kV HBM event on short circuit that shows a duration of 1-2 microseconds (μsec). The current injected into an IC subjected to such a 2 kV HBM ESD event may be approximately 1.3 A. In contrast, referring to CDM chart 102, the peak current in a 500 V CDM event on typical Si chip products may be between 5 and 10 A, while the duration of the pulse may be on the order of 1 nanosecond (nsec). Compared to the HBM ESD event, the peak current of the CDM ESD event may be relatively high, while the duration of the pulse may be very small.

It is noted that the charts of FIG. 1 are merely examples for demonstrating the disclosed concepts. The curves in the charts 101 and 102 are intended to demonstrate a general relationship among voltage, current and time. The curves are not intended to imply specific values or precise waveforms.

Figure 2:
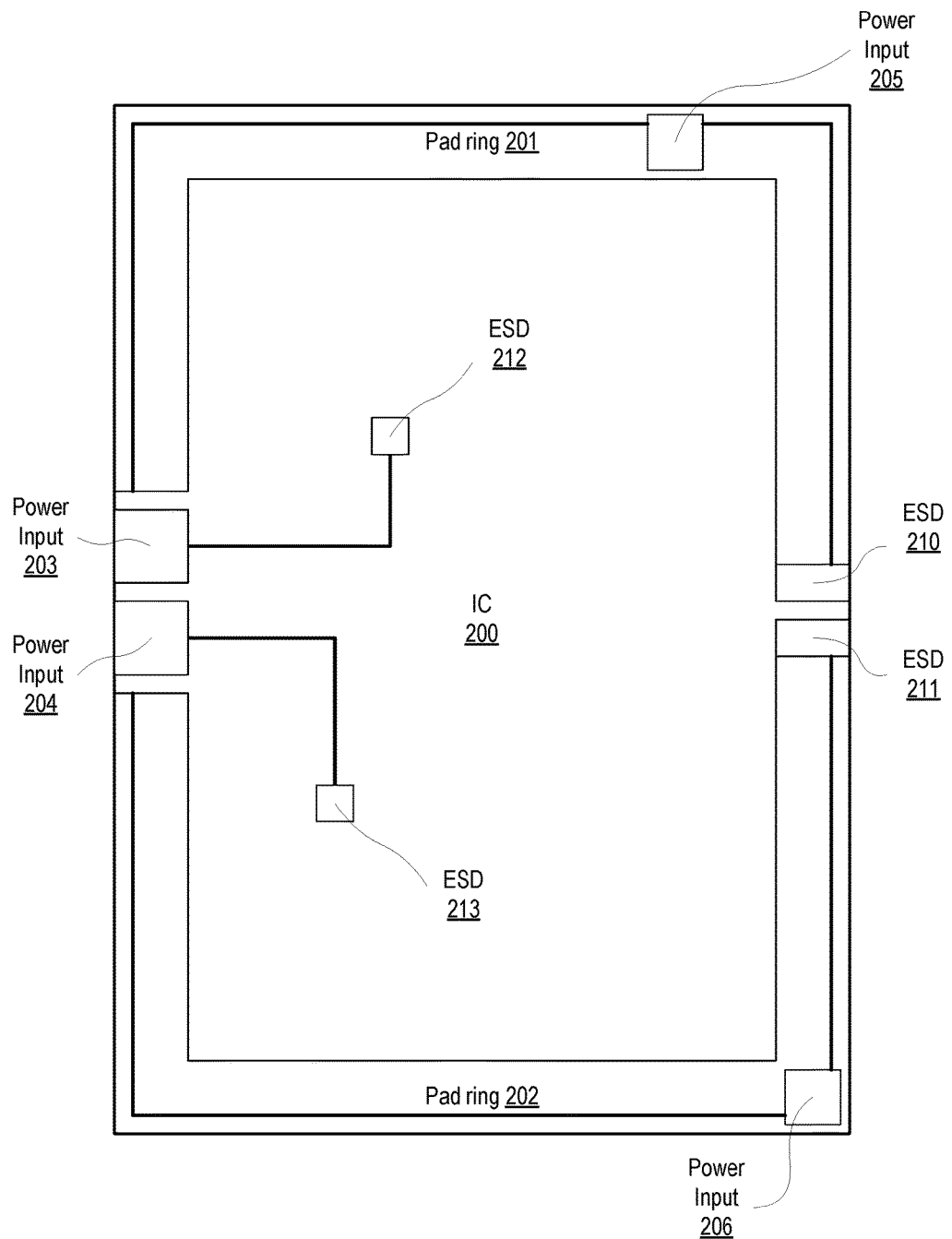
FIG. 2 shows placements of ESD protection circuits on an embodiment of an integrated circuit.

Turning to FIG. 2, a block diagram of an embodiment of an integrated circuit (IC) is illustrated. In the illustrated embodiment, IC 200 includes pad ring 201, pad ring 202, power input 203, and power input 204. Also included in IC 200 are ESD circuits 210-213, in which ESD circuits 210 and 211 are included in pad rings 201 and 202, respectively, while ESD circuits 212 and 213 are located among circuitry within IC 200. IC 200 may correspond to any type of IC, such as, for example, a microprocessor, a system-on-a-chip (SoC), a broadband processor, a memory device, etc.

Pad rings 201 and 202 each include multiple pads that are coupled to terminals in a package of IC 200. Each pad ring 201 and 202 may include respective combinations of pads, including input, output, input/output (I/O), analog, and power supply pads. In the illustrated embodiment, pads in pad ring 201 are powered from a power supply coupled to power input 205, and pads in pad ring 202 are powered from a power supply coupled to power input 206. Power inputs 205 and 206 may be coupled to power supplies with different voltage levels allowing their respective pads to be coupled to other ICs with power supplies at similar voltage levels. For example, some pads in pad ring 201 may be coupled to a non-volatile memory device operating from a power supply that is also coupled to power input 205, while pads in pad ring 202 may be coupled to dynamic random access memory (DRAM) chips operating from a power supply that is also coupled to power input 206, with a different voltage level than power input 205.

Pad rings 201 and 202 may each include at least one ESD circuit. For example, in the present embodiment, pad rings 201 and 202 include ESD circuits 210 and 211, respectively. In various embodiments, pad ring 201 may include a single ESD circuit 210 coupled to multiple pads coupled to the same voltage supply in pad ring 201, multiple ESD circuits 210 each one coupled to a respective pad, or a combination thereof. In the current embodiment, ESD circuits 210 and 211 are each coupled to multiple pads in the respective pad rings 201 and 202.

The present embodiment of IC 200 also includes power inputs 203 and 204. Neither power input 203 nor 204 may be coupled to a pad ring, but instead provide power to internal circuits of IC 200. Each of power inputs 203 and 204 is coupled to a respective one of ESD circuits 212 and 213.

To safely discharge current from an ESD event, two factors may be considered during the design of an ESD circuit. The first of these is that the ESD circuit is enabled for a sufficient duration to discharge current injected by the ESD event. The second of these is that the ESD circuits are able to handle the stress from the voltage levels and the currents resulting from the ESD event.

In the embodiment of IC 200, ESD circuits 212 and 213 may be subjected to different forms of ESD. For example, since ESD circuits 210 and 211 are coupled to pads that are coupled to exposed metal pins of the package of IC 200, ESD circuits 210 and 211 may be subjected to HBM type ESD events. In contrast, ESD circuits 212 and 213 are coupled to internal circuits of IC 200 and may not have any exposure outside of the package other than through the power inputs themselves. ESD circuits 212 and 213 may then be more likely to be subjected to CDM type ESD events. Due to the different type of ESD events they are subjected to, ESD circuits 210 and 211 may utilize a different design than ESD circuits 212 and 213. For example, ESD circuits 210-213 may all be designed to discharge ESD events for a predetermined amount of time. ESD circuits 210 and 211 may, however, be designed to discharge for an amount of time that is equal to or greater than an expected length of an HBM type of ESD event, while ESD circuits 212 and 213 may be designed to discharge for an amount of time that is equal to or greater than an expected length of a CDM type of ESD event, which may be less than the expected time of the HBM type. Embodiments of various ESD circuit designs will be disclosed below.

It is noted that IC 200 illustrated in FIG. 2 is merely an example. In other embodiments, a different number of ESD circuits may be included, and the ESD circuits maybe in any suitable location in IC 200. Additionally, other embodiments may include a single pad ring or more than two pad rings.

Figure 3:
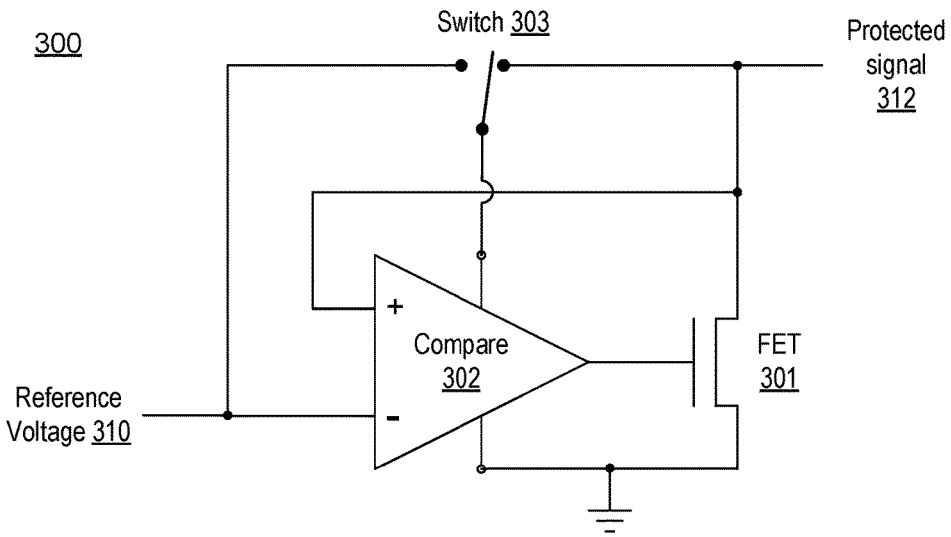
FIG. 3 illustrates an embodiment of an ESD protection circuit.

Moving now to FIG. 3, a block diagram for an embodiment of an ESD protection circuit is illustrated. ESD circuit 300 may correspond to ESD circuit 210 and/or 211 of IC 200 in FIG. 1. ESD circuit 300 includes FET 301, comparison circuit (compare) 302, and switching circuit (switch) 303. Two signals are received by ESD circuit 300, reference voltage 310 and protected signal 312.

In the illustrated embodiment, FET 301 is a field effect transistor. In other embodiments, however, any suitable type of switched device may be used, such as, for example, a bipolar junction transistor (BJT), may be employed. FET 301 is enabled when a voltage level of protected signal 312 rises above a voltage level of reference voltage 310. When FET 301 is enabled, protected signal 312 is coupled to a ground reference node to discharge protected signal 312, thereby reducing a risk of damage from high voltages and/or currents of an ESD event, such as illustrated in charts 101 and 102 in FIG. 1. The faster that charge from an ESD event can be dissipated to the ground reference, the better the chance of avoiding damage to circuits coupled to protected signal 312.

FET 301 is enabled and disabled dependent upon an output of comparison circuit 302. Comparison circuit 302 may be implemented as any suitable circuit capable of receiving reference voltage 310 and protected signal 312 and asserting a voltage level on the gate of FET 301 that is high enough to turn FET 301 sufficiently on to couple protected signal 312 to the ground reference. In the illustrated embodiment, comparison circuit 302 includes a positive and a negative input terminal. When a voltage level on the negative input terminal is greater than a voltage level on the positive input terminal, then the output of comparison circuit 302 is low, disabling FET 301, placing FET 301 in an "off state" in which current is blocked from flowing from the protected signal 312 to the ground reference. When the voltage level on the positive input terminal is above the voltage level on the negative input terminal, the output of comparison circuit 302 is high, enabling FET 301 into an "on state" in which current may flow from the protected signal 312 to the ground reference.

Switch 303 is coupled to a power terminal for comparison circuit 302. In the current embodiment, switch 303 is designed to couple the signal with a higher voltage level to the power terminal, either reference voltage 310 or protected signal 312. During a normal power-on sequence, reference voltage 310 may be designed to power-on before other power supplies in IC 200, including any power supply coupled to protected signal 312. In addition, a voltage level of reference voltage 310 may be selected such that the voltage level of reference voltage 310 is always greater than or equal to the maximum operating voltage level of the protected signal 312. Enabling reference voltage 310 before other power supplies may prevent FET 301 from inadvertently turning on and creating an unwanted path to the ground reference during the power-on sequence. Such inadvertent paths to ground may cause increased current in IC 200, referred to herein as "in-rush" current. Excessive in-rush current may delay rise times of power supplies, in turn, delaying full power operation of IC 200. In some cases, in-rush current may cause one or more devices in IC 200 to enter a "latch up" mode in which a high current path from a power source to the ground reference is created and cannot be disabled without removing the power source.

Under some conditions, protected signal 312 may be subjected to an ESD event while reference voltage 310 is disabled or before reference voltage 310 has otherwise been fully enabled. In such circumstances, the ESD event may cause the voltage level of protected signal 312 to rise above the voltage level of reference voltage 310, thereby causing switch 303 to couple protected signal 312 to the power terminal of comparison circuit 302, providing power to allow comparison circuit 302 to detect the higher voltage of protected signal 312 and in response, enable FET 301 and thereby dissipate the charge from the ESD event.

It is noted that ESD circuit 300 of FIG. 3 merely illustrates one example embodiment. Only the components necessary to demonstrate the disclosed concepts are shown. In other embodiments, additional components may be included. A different number of components may be included in other embodiments, such as, for example, multiple FETs 301 for dissipating larger amounts of charge.

Figure 4:
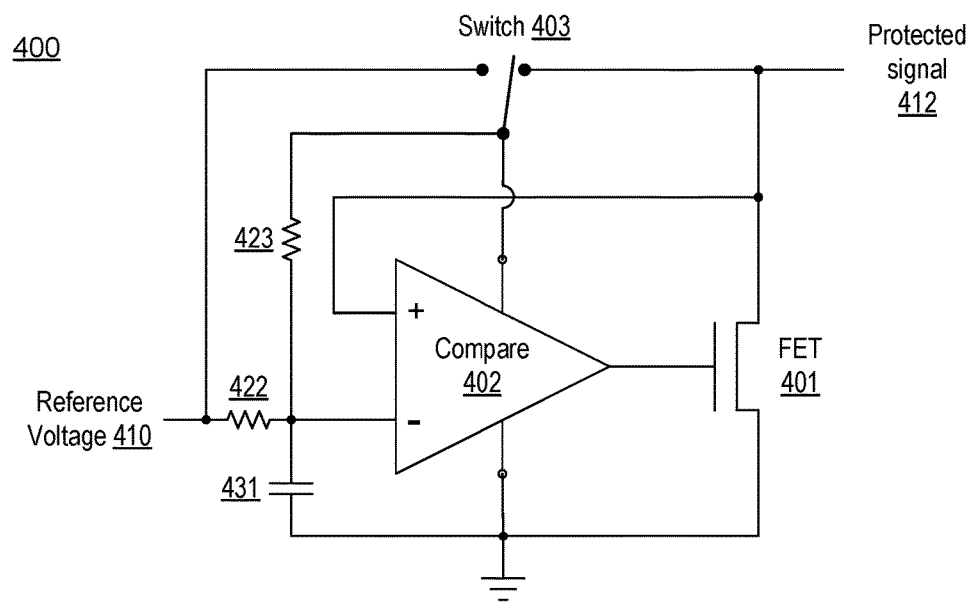
FIG. 4 illustrates another embodiment of an ESD protection circuit.

Turning now to FIG. 4, a circuit diagram of an embodiment of another ESD circuit is illustrated. In some embodiments, ESD circuit 400 may correspond to ESD circuit 210 and/or 211 of IC 200 in FIG. 1. Similar to ESD circuit 300, ESD circuit 400 includes comparison circuit (compare) 402 coupled to FET 401, as well as switching circuit (switch) 403. Additionally, ESD circuit 400 includes resistors 422 and 423 as well as capacitor 431, all coupled to one input of comparison circuit 402. Two signals are received by ESD circuit 400, reference voltage 410 and protected signal 412.

FET 401, comparison circuit 402 and switch 403 all perform functions similar to those described above for similarly named and numbered components in FIG. 3, except where noted below. ESD circuit 400 operates in a similar manner as ESD circuit 300. Resistor 423 is coupled from the power terminal of comparison unit 402 to a negative input terminal of comparison unit 402. Resistor 423 may act as a pullup device to keep the voltage level of the negative input terminal above the positive input terminal if reference voltage 410 has not stabilized at its operating voltage level and while no ESD event is occurring on the protected signal 412. It is noted that, as used herein, a "pullup device" refers to a resistive device (e.g., a resistor or biased transistor) that is coupled between a circuit node and a power source such that a voltage level of the circuit node is charged or "pulled up" to a voltage level of the power source when no other signal coupled to the circuit node is driving the voltage level of the circuit node to a different voltage level.

If, however, an ESD event does occur on the protected signal 412 before reference voltage 410 stabilizes, then switch 403 couples the higher voltage on the protected signal 412 to the power terminal of the comparison circuit as well as to the negative input terminal. Capacitor 431, in combination with resistor 423, forms a resistive-capacitive (RC) circuit that delays the rise in the voltage level of the protected signal 412 compared to the rise in voltage level on the positive input terminal which is coupled to the protected signal without an additional resistor. The delay of ESD spike to the negative input terminal allows the voltage to rise faster on the positive input terminal and, in response, comparison circuit 402 outputs a high level, enabling FET 401 to discharge the ESD event on the protected signal 412.

Comparison circuit 402 may enable FET 401 for a suitable amount of time to dissipate charge from protected signal 412 depending on a type of ESD event that ESD circuit 400 is designed to mitigate. For example, if ESD circuit 400 is designed for HBM types of ESD events, then comparison circuit 402 may enable FET 401 for one or more μsecs. If, however, ESD circuit 400 is designed for CDM types of ESD events, then the amount of time may be reduced to tens of nsecs or less. The time constant (a determining factor of how fast capacitor 431 charges or discharges) of the RC circuit may be selected to match a duration of an expected type of ESD event.

Resistor 422 is coupled between the negative input terminal and the power source of reference voltage 410. Resistor 422 allows the pullup of resistor 423 to pullup the voltage level on the negative input terminal when the source of reference voltage 410 is not yet stable. The resistance value of resistor 422 may be selected to be one or more orders of magnitude less than the resistance value of resistor 423 so that reference voltage 410 may overdrive the pullup from resistor 423 when the power source is stable.

It is noted, that, as used herein, a voltage level or power source "stabilizing" or being "stable" refers to a signal reaching a particular voltage level, from which deviations are comparatively negligible. Circuits and signals in an integrated circuit may be susceptible to various influences, such as signal noise coupled from other, nearby circuits. Such influence may cause deviations in the voltage level of an otherwise steady-state signal.

It is noted that ESD circuit 400 of FIG. 4 is merely an example of an ESD circuit. The circuit diagram of FIG. 4 has been simplified to highlight features relevant to this disclosure. In other embodiments, additional components may be included. The components shown in FIG. 4 are not intended to illustrate physical locations of components used in actual circuits.

Figure 5:
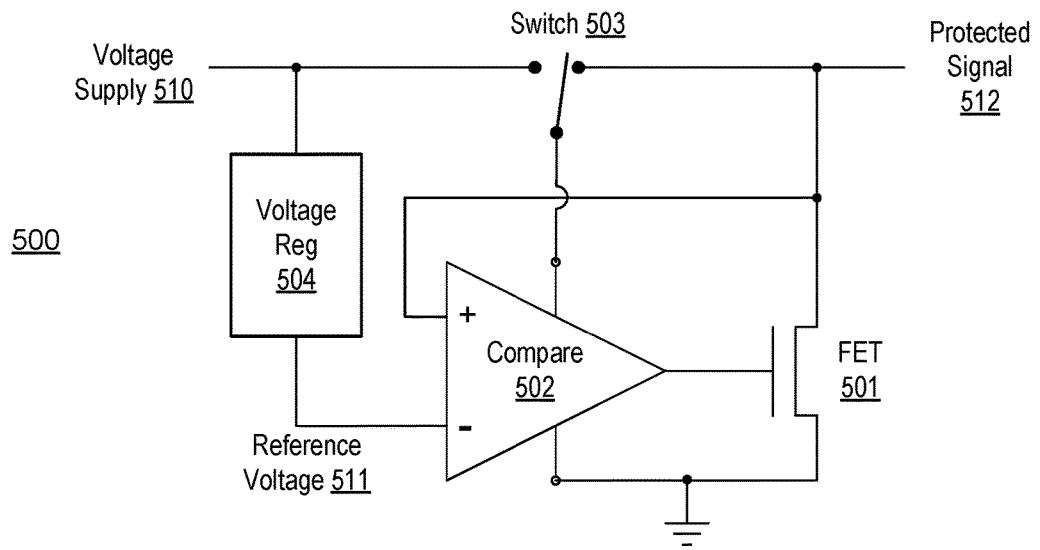
FIG. 5 shows an embodiment of an ESD protection circuit that includes a voltage regulator.

Moving to FIG. 5, a circuit diagram for another embodiment an ESD protection circuit is shown, one that includes a voltage regulator. ESD circuit 500 may, in some embodiments, correspond to ESD circuit 210 and/or 211 of IC 200 in FIG. 1. Similar to ESD circuit 300, ESD circuit 500 includes comparison circuit (compare) 502 coupled to FET 501, as well as switching circuit (switch) 503. Additionally, ESD circuit 500 includes voltage regulator 504 coupled to the negative input terminal of comparison circuit 502. Two signals are received by ESD circuit 500, voltage supply 510 and protected signal 512. Reference voltage 511 is generated from voltage supply 510.

In the illustrated embodiment, operation of ESD circuit 500 is similar to what was described for ESD circuit 300 in FIG. 3. Comparison circuit 502 compares a voltage level of reference voltage 511 to a voltage level of protected signal 512. While the voltage level of reference voltage 511 is higher, an output of comparison circuit 502 disables FET 501, restricting the flow of current from the protected signal 512 to the ground reference. If the voltage level of the protected signal 512 rises above reference voltage 511, then the output of comparison circuit enables FET 501, allowing current to flow and the protected signal to be discharged.

In the embodiment of ESD circuit 500, voltage supply 510 powers comparison circuit through switch 503 as long as an ESD event is not active. Voltage regulator 504 is used to generate reference voltage 511 at a reduced voltage level from voltage supply 510. Voltage regulator 504 may allow for selection of the voltage level of reference voltage 511 that is preferential for a particular expected type or types of ESD events, while maintaining a higher operating voltage level for comparison circuit 502. For example, a higher voltage level may be selected such that a higher voltage level on the protected signal is needed to trigger comparison circuit 502, thereby reducing a chance of lower level voltage spikes on the protected signal enabling FET 501 when the protected signal does not necessarily need to be discharged. On the contrary, a lower voltage level of reference voltage 511 may be selected, resulting in comparison circuit 502 triggering more quickly due to a rise in the voltage level of the protected signal. The lower voltage may be used to protect circuits that are more sensitive to ESD events, while the higher voltage level may be used with more robust circuits or circuits that are disrupted more easily when FET 501 is enabled.

It is noted that ESD circuit 500 of FIG. 5 merely illustrates one particular embodiment. Only the components necessary to demonstrate the disclosed concepts are shown. Additional components may be included, in other embodiments. In other embodiments, different numbers of components may be employed. For example, additional FETs may be coupled in parallel with FET 501 to allow for the dissipation of larger amounts of charge during ESD events.

Figure 6:
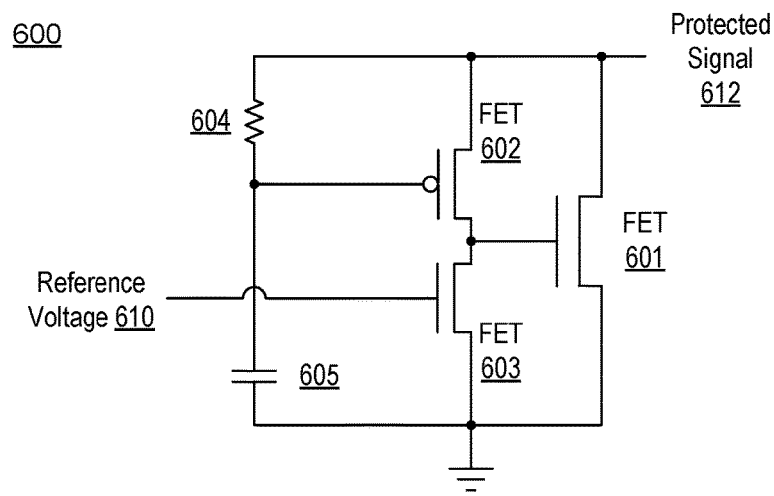
FIG. 6 shows another embodiment of an ESD protection circuit.

Turning to FIG. 6, a circuit diagram of another embodiment of an ESD circuit is illustrated. ESD circuit 600 may, in some embodiments, correspond to ESD circuit 210 and/or 211 of IC 200 in FIG. 1. ESD circuit 600 includes FET 601 coupled to FET 602 and FET 603. Additionally, ESD circuit 600 includes resistor 604 as well as capacitor 605, both coupled to FET 602. Two signals are received by ESD circuit 600, reference voltage 610 and protected signal 612.

Similar to other disclosed embodiments, FET 601 is used to protect the protected signal 612 from an ESD event by dissipating charge from the ESD event to a ground reference. FET 601 is enabled and disabled by a circuit including FET 602 and FET 603. In the present embodiment, upon a power-on of ESD circuit 600, reference voltage 610 is enabled before the protected signal 612. FET 603 is enabled and pulls a control node of FET 601 to the ground reference, disabling FET 601. With FET 601 disabled and therefore not conducting current, in-rush current may be prevented through FET 601 during power-on of ESD circuit 600.

If an ESD event occurs on the protected signal 612, then the drain terminal of FET 602 will be pulled to a much higher voltage level than the voltage level of reference voltage 610. Capacitor 605 and resistor 604 prevent the control gate of FET 602 from rising as fast protected signal 612. As a result, a voltage differential between the control gate and drain of FET 602 causes FET 602 to be enabled, thereby enabling FET 601. Enabled FET 601 is able to dissipate the charge from the ESD event on the protected signal 612. Meanwhile, the voltage level of the control gate of FET 602 rises at a rate dependent upon a time constant determined by the values of resistor 604 and capacitor 605. The control gate of FET 602 eventually rises to a point where FET 602 cannot conduct enough current to overdrive FET 603, thereby causing the control gate of FET 601 to be pulled low and disabling current flow through FET 601. The control gate of FET 603 is controlled by reference voltage 610, rather than by the R-C elements resistor 604 and capacitor 605. When reference voltage 610 is stable, FET 603 is enabled which, in turn, disables FET 601. FET 603 is designed to overwhelm the R-C triggering mechanism described above that turns on FET 602 when the voltage level of the protected signal 612 is near or below the voltage level of reference voltage 610, thereby disabling FET 601 at normal operating and startup levels of protected signal 612.

In some embodiments, FET 602 may be designed to have a lower resistance value when enabled than FET 603, making it easier to compensate for off-state leakage of FET 603 during ESD events. In addition, the resistance value of resistor 604 and the capacitance value of capacitor 605 may be selected to keep FET 601 enabled for a particular amount of time. The particular amount of time may be chosen based on a type of ESD event expected to occur.

It is noted that ESD circuit 600 of FIG. 6 is an example of an ESD circuit. The circuit diagram of FIG. 6 has been simplified to highlight features pertinent to this disclosure. In other embodiments, additional components may be included.

Figure 7:
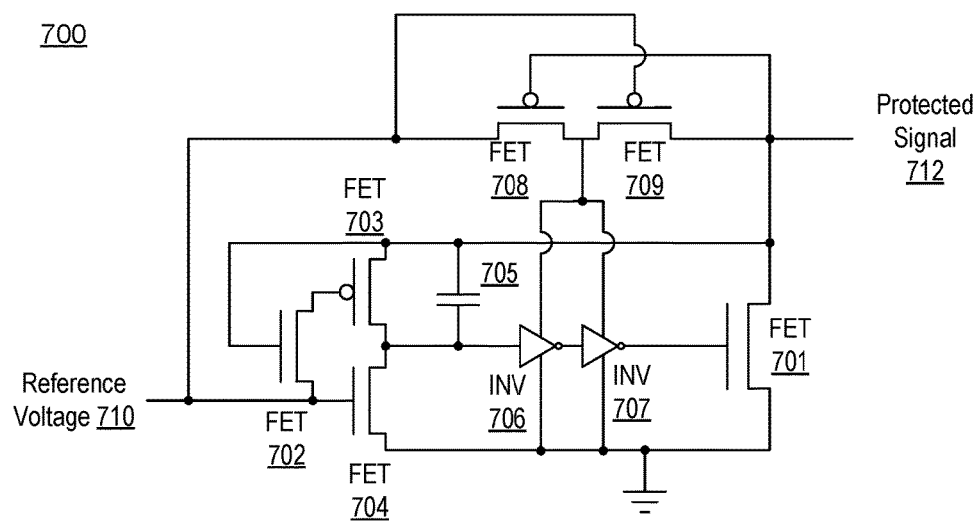
FIG. 7 illustrates another embodiment of an ESD protection circuit.

Moving now to FIG. 7, a circuit diagram for a further embodiment of an ESD circuit is illustrated. ESD circuit 700 may correspond to ESD circuit 210 and/or 211 of IC 200 in FIG. 1. ESD circuit 700 includes FET 702 coupled to FET 703 and FET 704, which are, in turn, coupled to capacitor 705 and inverter (INV) 706. Inverter 706 is coupled to inverter (INV) 707, as well as o FET 708 and FET 709. Both inverter 707 and FET 709 are coupled to FET 701. Two signals are received by ESD circuit 700, reference voltage 710 and protected signal 712.

In the illustrated embodiment, FET 708 and FET 709 are used as a switch to power inverters 706 and 707 from the signal with the higher voltage level, either reference voltage 710 or the protected signal 712. While protected signal 712 is not experiencing an ESD event, the voltage level of reference voltage 710 is higher than the voltage level of protected signal 712, resulting in FET 708 being enabled and FET 709 being disabled. Power is then supplied to inverters 706 and 707 from reference voltage 710.

Upon a power-on of ESD circuit 700, where reference voltage 710 may be required to power-on before other power supplies or signals for this circuit, once the voltage level of reference voltage 710 rises above the threshold voltage of FET 704, FET 704 is enabled, pulling the input to inverter 706 low, which drives the input to inverter 707 high and the control gate of FET 701 low. FET 701 is disabled, inhibiting current flow from the protected signal to the ground reference. In order to enable FET 702, the voltage level of protected signal 712 must be greater than the voltage level of reference voltage 710 plus a threshold voltage of FET 702. While the voltage level of protected signal 712 is not higher than the voltage level of reference voltage 710 plus the threshold voltage of FET 702, FET 702 is disabled, preventing FET 703 from turning on, which avoids in-rush current through FET 701 during the power-on of ESD circuit 700.

If an ESD event occurs on the protected signal 712, then, once the voltage level of protected signal 712 rises above the voltage level of reference voltage 710, FET 708 is disabled and FET 709 is enabled, thereby providing a higher voltage level to the power terminals of inverters 706 and 707, which may increase the drive strength of each inverter. The high voltage on protected signal 712 also enables FET 702, which in turn enables FET 703. Once the voltage level of protected signal 712 reaches a sufficient level, FET 703 is able to overdrive FET 704 and cause the input of inverter 706 to go from low to high. The output of inverter 706 will transition from high to low and vice versa for the output of inverter 707. The high output of inverter 707 enables FET 701, thereby allowing FET 701 to dissipate the charge of the ESD event on the protected signal 712.

Static CMOS inverters, such as those shown and described herein, may be a particular embodiment of an inverting amplifier that may be employed in the circuits described herein. In other embodiments, however, any suitable configuration of inverting amplifier that is capable of inverting the logical sense of a signal may be used, including inverting amplifiers built using technology other than CMOS.

It is noted that ESD circuit 700 of FIG. 7 illustrates an example embodiment. The illustration of FIG. 7 is limited to the components necessary to demonstrate concepts disclosed herein. In other embodiments, additional components may be included. A different number of components may be included in other embodiments.

It is also noted that some features of the ESD circuits disclosed in FIGS. 3-7 may be combined in various embodiments. For example, resistors 422 and 423 and capacitor 431 shown in FIG. 4 may be used in a similar configuration with ESD circuit 700 of FIG. 7. As another example, voltage regulator 504 shown in FIG. 5, may be combined with ESD circuit 700 of FIG. 7 to provide reference voltage 710.

Figure 8:
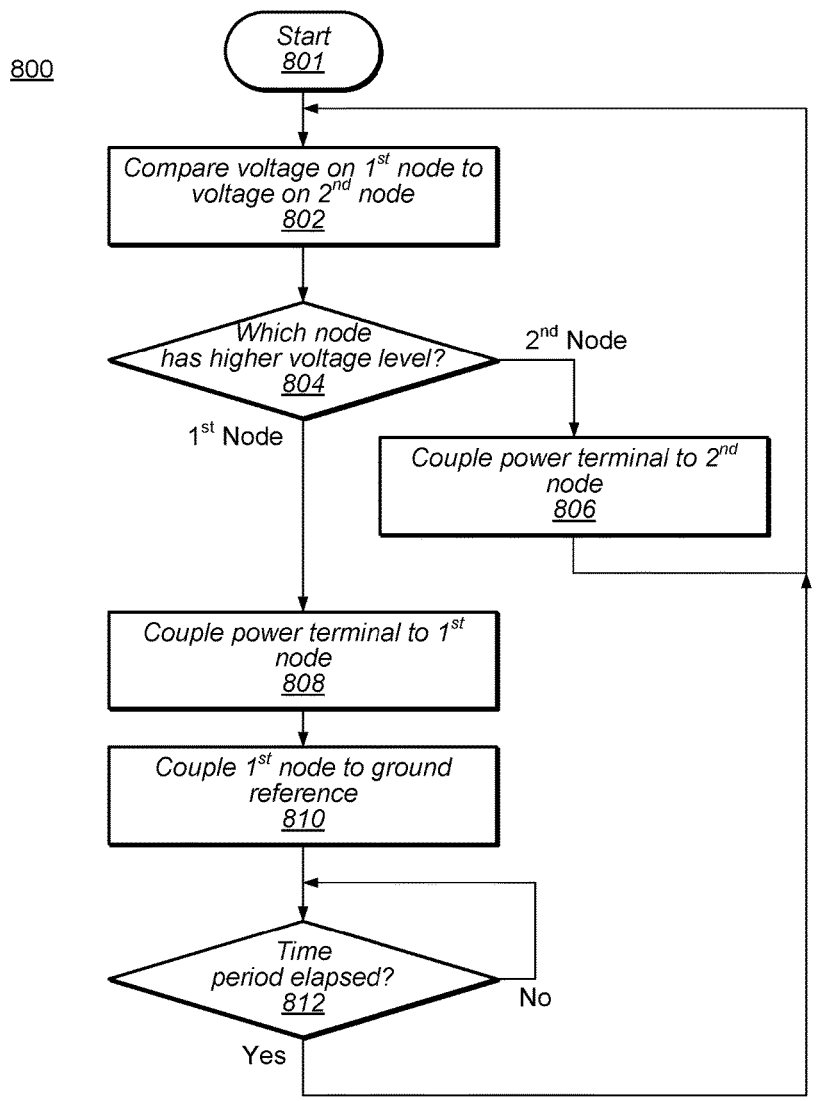
FIG. 8 illustrates a flow diagram depicting an embodiment of a method for operating an ESD protection circuit.

Turning now to FIG. 8, a flow diagram for an embodiment of a method of operation for an ESD protection circuit is illustrated. Method 800 may be applied, in various embodiments, to previously presented ESD circuits 300, 400, 500, or 700. In the present embodiment, method 800 is applied to ESD circuit 400 of FIG. 4. Referring collectively to the embodiment illustrated in FIG. 4, and the flow diagram of FIG. 8, method 800 begins in block 801.

In the illustrated embodiment, a voltage on a first terminal is compared to a voltage on a second terminal (block 802). Referring to FIG. 4, switch 403 compares a voltage level of protected signal 412 to a voltage level of reference voltage 410. For ESD circuit block 400 to protect signal 412, the critical first step is the selection of reference voltage 410. For normal operation of ESD circuit block 400 and to mitigate in-rush current, reference voltage 410 should power-up before protected signal 412. Reference voltage 410 should be maintained at an equal or higher voltage level than the voltage level of protected signal 412, and, therefore, reference voltage 410 should also power-down after protected signal 412. Further details regarding enabling of the reference voltage 410 are disclosed below in FIG. 9.

Further operation of method 800 may depend upon a result of the comparison (block 804). If reference voltage 410 has the higher voltage level, then the method moves to block 806 to couple a power terminal to reference voltage 410. Otherwise, if protected signal 412 has the higher voltage level, then the method moves to block 808 to couple the power terminal to protected signal 412. A higher voltage level on protected signal 412 may be indicative of an ESD event or other type of EOS occurring, for either power-on or power-off conditions. In some embodiments, such as, for example, the embodiment of FIG. 7, for the method to move to block 808, the voltage level of protected signal 712 may be higher than the voltage level of reference voltage 710 plus an offset voltage, such as, e.g., a voltage threshold of FET 702.

If the voltage level of reference voltage 410 is higher, then switch 403 couples the power terminal of comparison circuit to reference voltage 410 (block 806). A higher voltage level on reference voltage 410 may indicate a normal operating condition for ESD circuit 400. Switch 403 enables a path from reference voltage 410 to the power terminal to provide power to comparison circuit 402. An output of comparison circuit 402 control FET 401. During normal operation, as well as during a power-on sequence, FET 401 is disabled to inhibit current flow from protected signal 412 to a ground reference. During a power-on sequence, if FET 401 were to be enabled before power supplies in the IC are powered and stable, then in-rush current may occur through FET 401, potentially delaying the power-on sequence, or causing a latch up condition in FET 401 which could prevent proper operation of ESD circuit 400 and could cause damage to the circuit. The method returns to block 802 to continue comparing reference voltage 410 to protected signal 412.

If the voltage level of protected signal 412 is determined to be higher in block 804, then switch 403 couples protected signal 412 to the power terminal (block 808). The higher voltage level of protected signal 412 may be indicative of an ESD or other type of EOS event occurring on protected signal 412. By switching the power terminal of comparison circuit 402 from reference voltage 410 to protected signal 412, comparison circuit 402 is power via the higher of the two voltage levels. The higher voltage level may help to drive an output signal from comparison circuit 402. Powering comparison circuit with the higher voltage level may be of particular importance when ESD circuit is otherwise unpowered or the power source for reference voltage 410 is turning on and not yet stable. An unstable reference voltage 410 may not provide enough power to comparison circuit 402 to fully drive the control gate of FET 401 with the stronger (higher) of the two available power sources. If FET 401 is not fully enabled during the ESD event, then charge from the ESD event may not be adequately dissipated and circuits coupled to protected signal 412 may be susceptible to latch up or EOS damage.

Protected signal 412 is coupled to a ground reference (block 810). After receiving power from switch 403, comparison circuit 402 detects the higher voltage level on protected signal 412 and enables FET 401 to couple protected signal 412 to the ground reference. FET 401 may be designed to pass more current than FETs used elsewhere in the IC for standard logic circuits. The increased current capabilities of FET 401 may help to dissipate charge from the ESD event before circuits coupled to protected signal 412 are damaged.

Further operations of method 800 may depend on an elapsed time since detecting the higher voltage on protected signal 412 (block 812). To allow the circuits coupled to protected signal 412 to return to normal operation, FET 401 should be disabled once the ESD event has passed. In some embodiments, a delay circuit, such as, for example, an RC circuit including resistors 422 and 423 and capacitor 431, may be used drive the output of comparison circuit 402 high only for a predetermined amount of time from detecting the higher voltage on protected signal 412. If the predetermined amount of time has not elapsed, then the method remains in block 812 with FET 401 enabled. Once the predetermined amount of time has elapsed, then the output of comparison circuit 402 is driven low and FET 401 is thereby disabled. The method returns to block 802 to continue comparisons between protected signal 412 and reference voltage 410.

It is noted that the method illustrated in FIG. 8 is an example for demonstrating the disclosed concepts. In other embodiments, operations may be performed in a different sequence. Additional operations may also be included.

Figure 9:
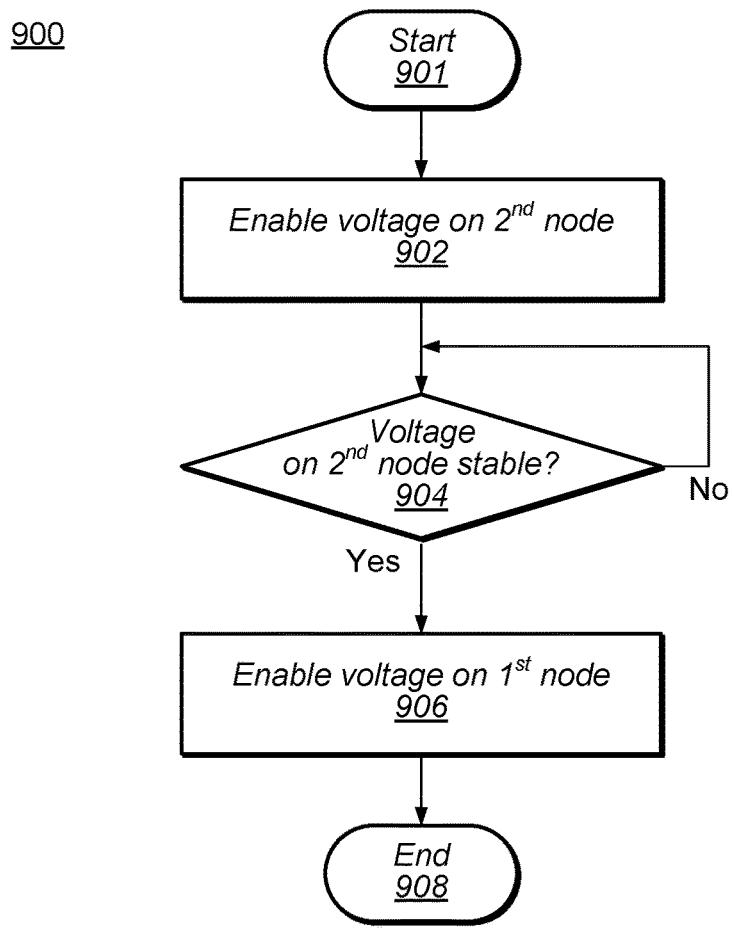
FIG. 9 illustrates a flow diagram for an embodiment of a method for enabling voltage signals for an ESD protection circuit.

Moving to FIG. 9, a flow diagram for an embodiment of a method for enabling or selecting a reference voltage signal for an ESD circuit is shown. Method 900 may be applied, in various embodiments, to previously presented ESD circuits 300, 400, 500, or 700. Referring collectively to the embodiment of FIG. 3 and the flow diagram depicted in FIG. 9, method 900 begins in block 901.

A first power source for generating reference voltage 310 is enabled (block 902). In the present embodiment, a first power source is used for reference voltage 310 that is enabled before a second power source coupled to protected signal 312 is enabled. In an IC that includes ESD circuit 300, the first power source may also provide power for one or more circuits in the IC, such as, for example, a clock source, a security circuit, or system management circuit. In some embodiments, the first power source may correspond to an "always on" power source that remains active while other power sources are disabled or placed into reduced power states for reduced power modes of the IC. In some embodiments, the first power source that generates reference voltage 310 may be the initial power source that is enabled in the IC. In various embodiments, reference voltage 310 may be generated at a same voltage level as the first power source or reference voltage 310 may be generated from a voltage regulating circuit coupled to an output signal from the first power source.

Further operations of method 900 may depend on the stability of the first power source (block 904). In some embodiments, an output of the first power source may be monitored to determine if it has reached a predetermined voltage level. In other embodiments, logic circuits powered by the first power source may generate a particular output signal as an indication that the first power source is generating an output with a voltage level sufficient for enabling the logic circuit. In further embodiments, timing circuit may be used to indicate a predetermined amount of time has elapsed since the first power supply has been enabled. The method remains in block 904 until the first power source is determined to be stable, at which point the method moves to block 906 to enable a second power source.

The second power source is enabled (block 906). The second power source generates protected signal 312. In various embodiments, protected signal may be generated directly from an output of the second power source or may be generated by circuits that are powered by the second power source. Protected signal 312 may be coupled to a terminal of the IC including ESD circuit 300, including one or more input and output pins of the IC. The method ends in block 908.

It is noted that during normal operation of ESD circuit block 400, if the voltage level of reference voltage 410 goes lower than the voltage level of the protected signal 412, ESD circuit block 400 may cause unwanted leakage current on the protected signal 412. This unwanted leakage current may potentially cause a malfunction of the IC or even physical damage to circuits of the IC.

It is also noted that the method illustrated in FIG. 9 is merely an example embodiment. Variations on this method are possible. Some operations may be performed in a different sequence, and/or additional operations may be included.

Figure 10:
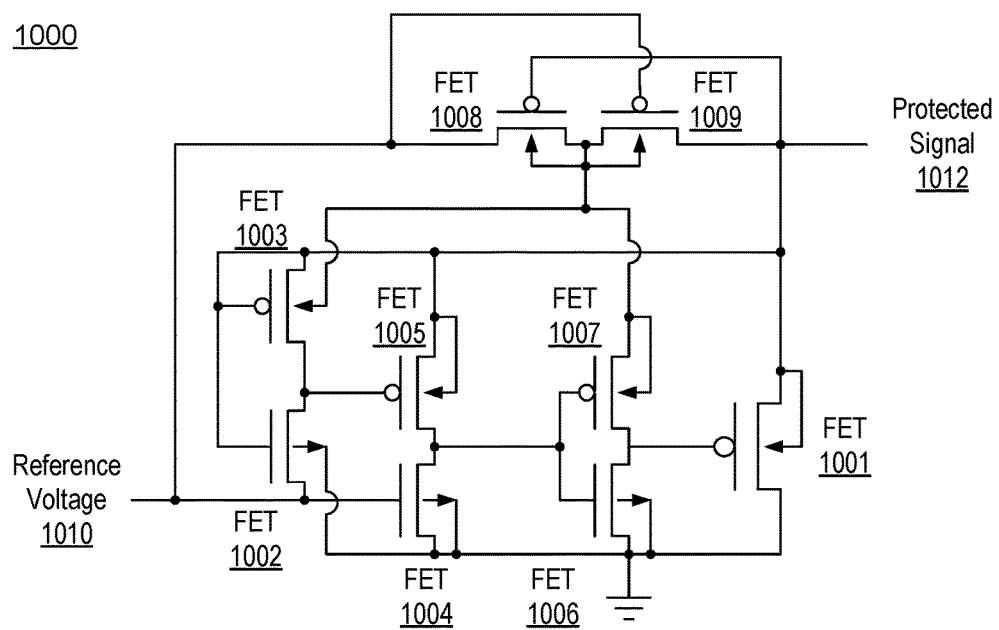
FIG. 10 illustrates another embodiment of an ESD protection circuit.

Turning now to FIG. 10, a circuit diagram for another embodiment of an ESD circuit is illustrated. ESD circuit 1000 may correspond to ESD circuit 210 and/or 211 of IC 200 in FIG. 1. ESD circuit 1000 includes FET 1002 coupled to FET 1003, FET 1004, and FET 1005. FET 1004 and FET 1005 are coupled to FET 1006 and FET 1007, which are, in turn, coupled to FET 1001. FET 1007 is coupled to FET 1008 and FET 1009. Two signals are received by ESD circuit 1000, reference voltage 1010 and protected signal 1012.

In the illustrated embodiment, bulk connections for each of the FETs are shown. The bulk connections for FET 1001 and FETs 1004-1009 utilize common configurations in which the bulk connection is made to the drain node for a p-channel FET and to the source node for an n-channel FET. The bulk connections for FET 1002 and 1003, however, are different. For FET 1002, the bulk connection coupled to the ground reference rather than to the source node which is coupled to reference voltage 1010. For FET 1003, the bulk connection is coupled to the outputs of FETs 1008 and 1009, which, as described above in regards to FIG. 7, is the higher voltage level between reference voltage 1010 and protected signal 1012. These configurations for FET 1002 and FET 1003 may allow FET 1002 and FET 1003 to be enabled at respective lower and higher voltage levels.

FET 1006 and FET 1007 are coupled to form an inverting circuit. An output from FET 1004 and FET 1005 forms the input to the inverting circuit and the output is coupled to the control gate of FET 1001. FET 1001 is changed from an n-channel, as shown in FIGS. 3-7, to a p-channel, such that a low signal from the output of FETs 1006-1007 enabled FET 1001. In the illustrated embodiment, FET 1008 and FET 1009 are used as a switch to power the inverting circuit of FET 1006 and FET 1007 from the higher voltage level between reference voltage 1010 and protected signal 1012.

While protected signal 1012 is not experiencing an ESD event, the voltage level of reference voltage 1010 is higher than the voltage level of protected signal 1012. FET 1002 is disabled, FET 1003 is enabled, resulting in FET 1005 being disabled. FET 1004 is enabled, thereby driving a low signal to FETs 1006 and 1007, resulting in FET 1007 being enabled and FET 1006 being disabled. FET 1007 pulls the control gate of FET 1001 high, thereby disabling FET 1001.

Upon a power-on of ESD circuit 1000, once the voltage level of reference voltage 1010 rises above the threshold voltage of FET 1004, FET 1004 is enabled, thereby driving a low signal to FETs 1006 and 1007, resulting in FET 1007 being enabled and FET 1006 being disabled. FET 1007 pulls the control gate of FET 1001 high, thereby disabling FET 1001. In order to enable FET 1002, the voltage level of protected signal 1012 must be greater than the voltage level of reference voltage 1010 plus a threshold voltage of FET 1002. While the voltage level of protected signal 1012 is not higher than the voltage level of reference voltage 1010 plus the threshold voltage of FET 1002, FET 1002 is disabled, preventing FET 1005 from turning on. In turn, FET 1006 is prevented from turning on, thereby avoiding in-rush current through FET 1001 during the power-on of ESD circuit 1000.

If an ESD event occurs on the protected signal 1012, then, once the voltage level of protected signal 1012 rises above the voltage level of reference voltage 1010, FET 1008 is disabled and FET 1009 is enabled, thereby providing a higher voltage level to the inverting circuit of FETs 1006 and 1007. The high voltage on protected signal 1012 also enables FET 1002, which in turn enables FET 1005. Once the voltage level of protected signal 1012 reaches a sufficient level, FET 1005 is able to overdrive FET 1004 and cause the input of inverting circuit of FETs 1006 and 1007 to go from low to high. FET 1006 will be enabled and pull the gate of FET 1001 low, thereby enabling FET 1001 to dissipate the charge of the ESD event on the protected signal 1012.

It is noted that ESD circuit 1000 of FIG. 10 illustrates an example embodiment. The illustration of FIG. 10 is limited to the components necessary to demonstrate concepts disclosed herein. In other embodiments, additional components may be included. A different number of components may be included in other embodiments.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus comprising:
   a device including a first terminal coupled to a first power supply signal, and a second terminal coupled to a ground reference, wherein the device is configured to couple the first terminal to the second terminal in response to an assertion of an enable signal;
a comparison circuit coupled to the device, wherein the comparison circuit is configured to:
compare a first voltage level of the first power supply signal to a second voltage level of a second power supply signal; and
assert the enable signal in response to a determination that the first voltage level is greater than the second voltage level; and
a switch circuit configured to:
couple a power supply terminal of the comparison circuit to the first power supply signal in response to a determination that the first voltage level is greater than the second voltage level; and
couple the power supply terminal of the comparison circuit to the second power supply signal in response to a determination that the first voltage level is less than the second voltage level.

2. The apparatus of claim 1, wherein the comparison circuit includes a capacitor, wherein a first terminal of the capacitor is coupled to a first input of the comparison circuit and a second terminal of the capacitor is coupled to the ground reference.

3. The apparatus of claim 1 wherein the comparison circuit includes a resistor, wherein a first terminal of the resistor is coupled to a first input of the comparison circuit and a second terminal of the resistor is coupled to the power supply terminal of the comparison circuit.

4. The apparatus of claim 1, wherein the comparison circuit includes a voltage reduction circuit configured to generate a comparison voltage signal dependent upon the second voltage level of the second power supply signal, wherein a third voltage level of the comparison voltage signal is less than the second voltage level.

5. The apparatus of claim 1, wherein the comparison circuit includes a delay circuit coupled between the second power supply signal and a first input of the comparison circuit, wherein the delay circuit is configured to delay propagation of changes in the second voltage level of the second power supply signal to the first input of the comparison circuit.

6. The apparatus of claim 1, wherein the device includes a field-effect transistor (FET).

7. The apparatus of claim 6, wherein the comparison circuit includes a digital comparator, and wherein an output of the digital comparator is coupled to a gate terminal of the FET.

8. A method, comprising:
comparing, by a comparison circuit, a first voltage level on a first node to a second voltage level on a second node;
coupling a power supply node of the comparison circuit to the first node in response to determining that the first voltage level is greater than the second voltage level;
coupling the power supply node of the comparison circuit to the second node in response to determining that the first voltage level is less than the second voltage level; and
coupling the first node to a ground reference in response to determining that the first voltage level is greater than the second voltage level.

9. The method of claim 8, further comprising increasing the second voltage level on the second node prior to increasing the first voltage level on the first node in response to detecting a power-on event.

10. The method of claim 8, wherein coupling the first node to a ground reference further comprises coupling the first node to a ground reference for a predetermined amount of time.

11. The method of claim 10, wherein the predetermined amount of time is greater than an expected time duration of an electrostatic discharge (ESD) event.

12. The method of claim 8, further comprising maintaining a third voltage level at a first input of the comparison circuit for a predetermined amount of time in response to detecting a reduction of the first voltage level on the first node, wherein the first input is coupled to the first node via a resistive device.

13. The method of claim 8, further comprising delaying propagation of changes in the second voltage level of the second node to a first input of the comparison circuit.

14. The method of claim 8, wherein coupling the first node to the ground reference further comprises determining that the first voltage level of the first node is greater than the second voltage level of the second node plus an offset voltage.

15. An integrated circuit (IC), comprising:
a first electrostatic discharge (ESD) protection circuit coupled to at least one terminal of the IC, wherein the first ESD protection circuit is configured to:
compare a first voltage level on a first node to a second voltage level on a second node, wherein the first node is coupled to the at least one terminal;
receive a power from the first node in response to a determination that the first voltage level is greater than the second voltage level;
receive a power from the second node in response to a determination that the first voltage level is less than the second voltage level; and
couple the first node to a ground reference in response to a determination that the first voltage level is greater than the second voltage level; and
a second ESD protection circuit coupled to an internal power supply signal, wherein the second ESD protection circuit is configured to:
receive power from the internal power supply signal;
detect an increase of a third voltage level of the internal power supply signal; and
couple the internal power supply signal to the ground reference in response to a determination that the third voltage level has increased by more than a predetermined threshold.

16. The IC of claim 15, further comprising a power supply configured to generate the second voltage level on the second node, wherein, upon a power-on event, the power supply is further configured to generate the second voltage level before power is supplied to the first node.

17. The IC of claim 15, wherein to couple the first node to the ground reference, the first ESD protection circuit is further configured to couple the first node to the ground reference for a first predetermined amount of time.

18. The IC of claim 17, wherein the first predetermined amount of time is greater than an expected time duration of a Human Body Model type of ESD event.

19. The IC of claim 18, wherein to couple the internal power supply signal to the ground reference, the second ESD protection circuit is further configured to couple the internal power supply signal to the ground reference for a second predetermined amount of time, and wherein the second predetermined amount of time is less than the first predetermined amount of time.

20. The IC of claim 19, wherein the second predetermined amount of time is greater than an expected time duration of a Charge Device Model type of ESD event.

* * * * *